United States Patent [19]
Ikeya et al.

[11] Patent Number: 6,036,822
[45] Date of Patent: Mar. 14, 2000

[54] THIN-FILM SOLAR CELL MANUFACTURING APPARATUS AND MANUFACTURING METHOD

[75] Inventors: Takeshi Ikeya; Kenji Sato; Kazuhiro Toyoda; Takeshi Kamiya, all of Shizuoka, Japan

[73] Assignee: Yazaki Corporation, Tokyo, Japan

[21] Appl. No.: 09/009,689

[22] Filed: Jan. 20, 1998

Related U.S. Application Data

[62] Division of application No. 08/651,610, May 22, 1996, Pat. No. 5,772,431.

[30] Foreign Application Priority Data

May 22, 1995 [JP] Japan .................................... 7-122493
Jun. 5, 1995 [JP] Japan .................................... 7-137668

[51] Int. Cl.⁷ .................................................. C23C 14/34
[52] U.S. Cl. ................... 204/192.15; 136/264; 136/265; 438/84; 205/109
[58] Field of Search ...................... 204/192.15; 136/264, 136/265; 438/84; 205/109

[56] References Cited

U.S. PATENT DOCUMENTS

| | | | |
|---|---|---|---|
| 2,189,624 | 2/1940 | Branbke | 432/254.2 |
| 2,495,561 | 1/1950 | Wilson | 432/254.2 |
| 4,383,130 | 5/1983 | Uroshevich | 136/261 |
| 4,963,423 | 10/1990 | Sekiguchi et al. | 428/409 |
| 5,275,714 | 1/1994 | Bonnet et al. | 205/109 |
| 5,399,504 | 3/1995 | Ohsawa | 437/5 |
| 5,489,372 | 2/1996 | Hirano | 205/109 |
| 5,731,031 | 3/1998 | Bhattacharya et al. | 427/76 |
| 5,772,431 | 6/1998 | Ikeya et al. | 432/254.2 |

FOREIGN PATENT DOCUMENTS

| | | | |
|---|---|---|---|
| 61-237476 | 10/1986 | Japan | H01L 31/04 |
| 5506334 | 9/1993 | Japan | H01L 31/04 |
| 9205586 | 4/1992 | WIPO | H01L 31/0216 |

OTHER PUBLICATIONS

"The Influence of Sodium on the Grain Structure of $CuInSe_2$ Films for Photovoltaic Applications"; 12th European Photovoltaic Solar Energy Converence; Apr. 11–15, 1994, pp. 1743–1746.

"CIS Sthin Film Collar Cell"; Tokio Nakada; New Ceramics (1994) No. 1, pp. 77–84.

*Primary Examiner*—Nam Nguyen
*Assistant Examiner*—Steven H. VerSteeg
*Attorney, Agent, or Firm*—Sughrue, Mion, Zinn Macpeak & Seas, PLLC

[57] ABSTRACT

A base is provided with a gas outlet pipe and a gas inlet pipe. A bell jar is placed on top of the base with an O-ring interposed between them. Thin-film solar cells and a Se powder are placed in a recess formed in a lower heating jig, and the lower heating jig is positioned on the base. An upper heating jig is placed on top of the lower heating jig. The upper heating jig is vertically moved by a vertically actuating mechanism. The upper and lower heating jigs are heated with a heater so as to react Se with the thin-film solar cells, whereby a $CuInSe_2$ alloy film is formed. In a method of manufacturing a thin-film solar cell, a molybdenum layer and a copper layer are formed on a substrate by sputtering. A selenium-dispersed indium layer is formed on the copper layer in a solution, which includes indium ions and dispersed selenium colloid, by electrodeposition. The thus formed selenium-dispersed indium layer and the selenium are heated in a sealed container. Alternatively, a conductive substrate is plated in a solution comprising copper ions and selenium ions, so that a copper-selenium layer is formed on the conductive substrate. The thus plated substrate is further plated in a solution comprising indium ions and selenium ions, so that an indium-selenium layer is formed on the copper-selenium layer. As a result, a pre-cursor is completed. Then, this precursor is subjected to heat treatment.

2 Claims, 5 Drawing Sheets

THIN-FILM SOLAR CELL MANUFACTURING APPARATUS AND MANUFACTURING METHOD

This is a divisional of application Ser. No. 08/651,610 filed May 22, 1996, and issued as U.S. Pat. No. 5,772,431, on Jun. 30, 1998.

BACKGROUND OF THE INVENTION

The present invention relates to an apparatus for manufacturing a thin-film solar cell formed of a compound semiconductor which consists of group IB elements, group IIIB elements and group VIB elements in the periodic table, and a method of manufacturing such a thin-film solar cell.

Attention has recently been focused on a compound semiconductor consisting of group IB, IIIB, and VIB elements in the periodic table which makes it possible to manufacture a thin-film solar cell having a superior photoelectric conversion efficiency and a large area at a low cost. Particularly, $CuInSe_2$ has the following advantageous characteristics:

(1) an absorption coefficient a as high as about $10^5$ cm which allows sufficient absorption of solar light even when the solar cell is formed as thin as about 2 $\mu$m, (2) a forbidden band of 1.1 eV which is suitable for photoelectric conversion of solar light, and (3) a considerably smaller degree of photo-deterioration compared to amorphous silicon. For these reasons, the compound semiconductor has been receiving the most attention. A method of manufacturing a thin-film solar cell is disclosed in, for example, Unexamined Japanese Patent Publication No. Sho. 61-237476.

FIG. 5 is a cross-sectional view of a conventional apparatus for manufacturing a thin-film solar cell.

This manufacturing apparatus constitutes a part of a heat treatment furnace disclosed in Unexamined Japanese Patent Publication No. Sho. 61-237476. A narrow and long cylindrical core pipe 51 is provided with a baffle 52, and this baffle is circumferentially disposed along the internal wall of the core pipe at the longitudinal center thereof. As a result, the core pipe 51 is divided into two chambers 53 and 54.

A thin-film solar cell 55 to be subjected to heat treatment comprises a glass substrate, an Mo film as a conductive film laid on the glass substrate, and a Cu-In/Se film laid on the Mo film. At this time, the Cu-In/Se film is not alloyed yet. A plurality of thin-film solar cells 55 to be subjected to heat treatment are placed in the chamber 53 (the chamber positioned on the left side in the drawing), and a crucible 56 which contains a Se material is placed in the other chamber 54 (the chamber positioned on the right side in the drawing). The core pipe 51 is heated to heat the thin-film solar cells 55 and the crucible 56, as a result of which Se is gasified. As shown in the drawing, an Ar gas is supplied into the core pipe 51 from the right side, so that the Se gas flows into the chamber 53 (the chamber positioned on the left side in the drawing). The solar cells 55 are then thermally treated, whereby the Cu-In/Se film of the solar cell is transformed into a $CuInSe_2$ alloy film.

Several propositions have already been made with respect to the relationship between temperature and duration of the heat treatment. For example, as shown in FIG. 6, the temperature of the chamber is increased from room temperature to 200–250 centigrades at a rate of 30 centigrade/min. The thus increased temperature is maintained for about 30 to 60 minutes, and the temperature is further increased to 400–450 centigrades at a rate of 30 centigrade/min. The thus increased temperature is then maintained for about 2 to 4 hours. The temperature is then cooled to room temperature.

The above described conventional heat treatment furnace has a simple structure and requires an inexpensive installation cost, and therefore it is widely used. However, the heat treatment furnace of this type is an open furnace, and the Ar and Se gases are kept flowing in the furnace. This results in considerably large amounts of the Se and Ar gases being used, which in turn adds to the cost. Further, this heat treatment furnace is not closed, and hence it is impossible to increase the pressure of the Se gas. The Se gas merely flows above and below the thin-film solar cell 55 or between the thin-film solar cells. For this reason, the Se gas fails to sufficiently react with the thin-film solar cell 55, which makes it difficult to form the $CuInSe_2$ alloy film. Eventually, a production yield drops.

Also, Unexamined Japanese Patent Publication No. Sho-61-237476 discloses a method of manufacturing the ternary alloy ($CuInSe_2$). According to this method, a precursor is formed by electrically depositing copper and indium on a conductive substrate on top of each other, and the thus formed precursor is heated in the flow of an inert gas which includes hydrogen seleniumide, whereby the copper-indium-selenium ternary alloy ($CuInSe_2$) layer is formed.

However, the method has such a problem that the conductive substrate and the ternary alloy layer are poorly in contact with each other and, therefore, the ternary alloy layer is apt to delaminate. Eventually, the thus manufactured solar cell has inferior characteristics.

Further, the precursor is heated in the flow of the inert gas including hydrogen seleniumide, and hence several tens to several hundreds as much hydrogen seleniumide as the stoichiometrically required volume of hydrogen selenide are required. The hydrogen selenide is significantly toxic, and therefore it is really troublesome to handle. Still further, the use of expensive inert gas adds to the cost.

There is other known method of manufacturing the copper-indium-selenium ternary alloy ($CuInSe_2$) as disclosed in International Publication Number WO 92/05586. A layer consisting of three components (hereinafter referred to as a precursor layer) is formed by plating, and the thus formed precursor layer is subjected to heat treatment, whereby a ternary alloy layer consisting of three components is formed.

It is not easy to form the precursor layer by controlling the ratio of the three components. Particularly, in the case of the technique as disclosed in Internal Publication Number 92/05586, a selenium powder is dispersed into a plating solution, and therefore it is necessary to continuously stir the solution during the course of plating. The stirring of the solution exerts a considerable influence on the composition of the plating layer.

The ratio of these three components is apt to change in the thicknesswise direction of the plating layer (the ratio of copper atoms in the plating layer is large when the plating is started, and it subsequently becomes smaller while the ratio of indium atoms becomes larger). Non-destructive analyzing means which analyze the real ratio of the atoms has not been available.

Therefore, it is very difficult to manufacture a thin-film solar cell comprising the three components at a stably controlled ratio.

Further, according to the above described conventional technique, a stable copper-indium alloy develops during the course of the plating operation. This copper-indium alloy prevents the growth of a copper-indium-selenium alloy crystal which is generated when the plating layer undergoes heat treatment after the plating operation. The copper-indium alloy also hinders the orientation of the copper-indium-selenium alloy crystal. The thus formed absorbing layer comprises the residual copper-indium alloy which does not have photoelectric converting characteristics, and hence the overall photoelectric conversion efficiency becomes low.

As well as the above described method, it is conceivable to apply sputtering and PVD methods, in which a layer is formed in a depressurized state, when forming the precursor layer. However, these methods provide lower productivity and also require large installation costs.

SUMMARY OF THE INVENTION

An object of the present invention is to provide a thin-film solar cell manufacturing apparatus which is used in manufacturing a thin-film solar cell including a $CuInSe_2$ alloy film as an absorbing layer, and which is capable of forming the stoichiometrically right amount of $CuInSe_2$ alloy film by causing a reduced amount of Se to sufficiently react with CuIn.

Another object of the present invention is to provide a method which can overcome the problem in the prior art, that is, a method which makes it possible to easily, safely, and inexpensively provide a superior copper-indium-selenium ternary alloy layer much less apt to delaminate.

In order to achieve the above objects, the present invention provides a thin-film manufacturing apparatus comprising: a vacuum system including a base which consists of an evacuating pipe and a gas inlet pipe, a bell jar disposed on top of the base with an O-ring interposed between them, and valves respectively provided in the evacuating pipe and the gas inlet pipe; a lower heating jig which is disposed on top of the base within the bell jar, which has the top thereof indented so as to receive a thin-film solar cell to be treated, and which has a heater and a temperature sensor disposed in a lower part of the lower heating jig; an upper heating jig which has a heater and a temperature sensor disposed in an upper part of the upper heating jig, and which forms a tight seal between the upper and lower heating jigs when it is rubbed against the top of the lower heating jig; and a mechanism for vertically moving the upper heating jig by external manipulation.

A thin-film solar cell manufacturing method of the present invention comprises four steps of: (1) forming a molybdenum layer on a substrate by sputtering; (2) forming a copper layer on the molybdenum layer by sputtering; (3) completing a precursor by electrically depositing a selenium-dispersed indium layer on the copper layer in a solution which includes indium ions and dispersed selenium colloid; and (4) putting the precursor and selenium in a container, and heating the container after it has been sealed.

Another thin-film solar cell manufacturing method of the present invention comprises the steps of: forming a copper-selenium layer on a conductive substrate by means of plating, using a solution including copper ions ($Cu^{2+}$) and selenium ions ($Se^{4+}$); completing a precursor by forming an indium-selenium layer by means of plating, using a solution including indium ions ($In^{3+}$) and selenium ions ($Se^{4+}$); and subjecting the thus formed precursor to heat treatment.

DETAILED DESCRIPTION OF THE PREFERRED EMBODIMENTS

Figure 1:
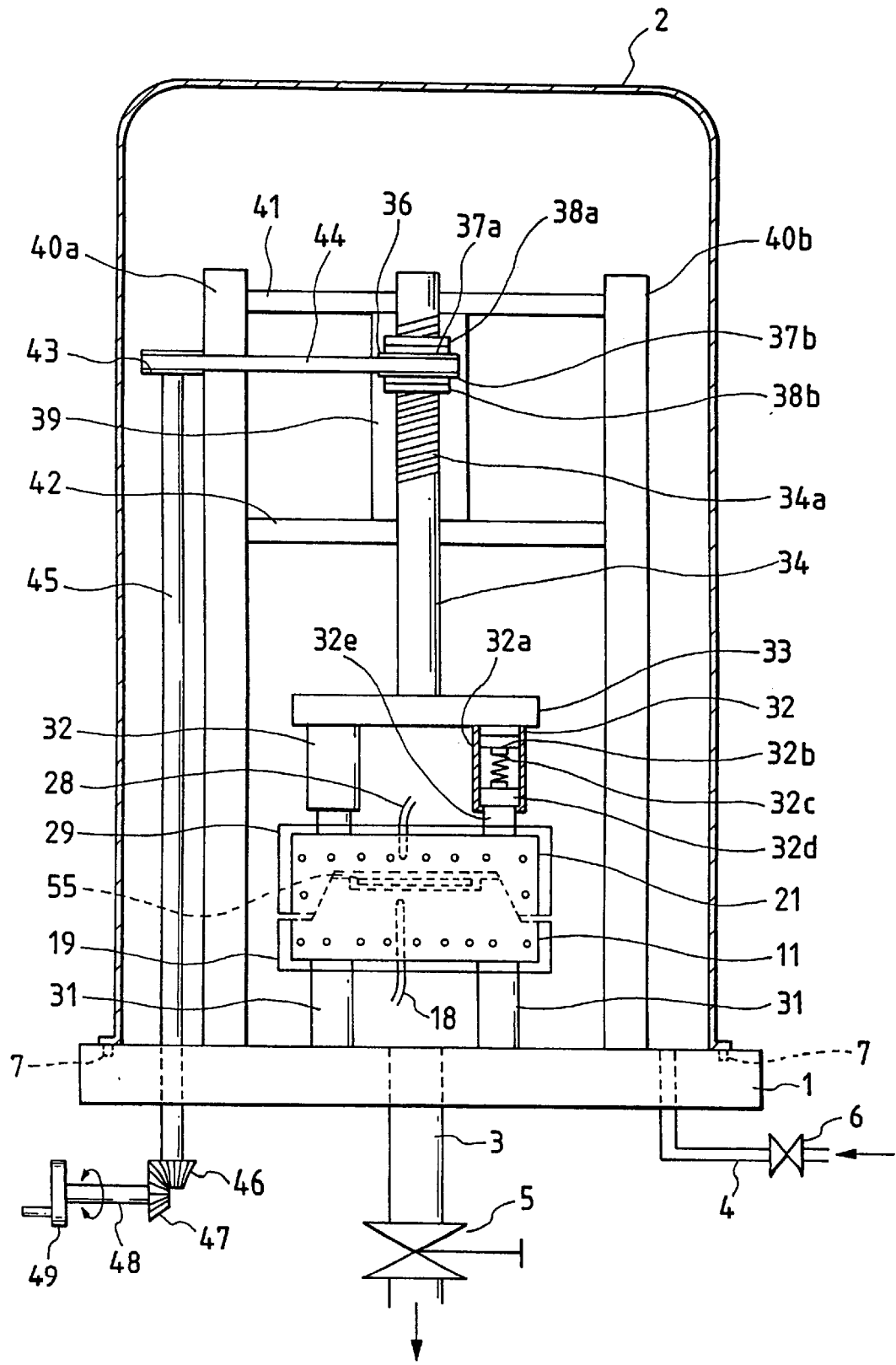
FIG. 1 is a partially cross-sectional front view of a thin-film solar cell manufacturing apparatus according to one embodiment of the present invention.

FIG. 1 is a partially cross-sectional front view of a thin-film solar cell manufacturing apparatus according to a first embodiment of the present invention.

A disk-shape base 1 is made of metal. A gas outlet pipe 3 and a gas inlet pipe 4 are provided at the center of the base 1. The gas outlet and inlet pipes 3 and 4 are respectively provided with valves 5 and 6. A glass-made bell jar 2 is placed on top of the base 1. An ordinary circular trench is formed in the area of the base 1 that comes into contact with the lower end of the bell jar 2, and an O-ring 7 is fitted into the trench. Thus, the bell jar 2 is sealed with the O-ring 7. A lower heating jig 11 is positioned at the center of the top surface of the base 1 while it is supported by posts 31. An upper heating jig 21 is placed on top of the lower heating jig 11. The lower and upper heating jigs 11 and 21 are provided with respective heat-shielding plates 19 and 29, which prevent heat from dissipating to the outside. The lower and upper heating jigs 11 and 21 will be described later in more detail.

A support 32 is attached to the upper heating jig 21. The support 32 comprises a cylinder 32a. A stopper 32b is fixedly inserted into the cylinder 32a, and a spring 32c is attached to the stopper 32b. A slider 32d is attached to this spring 32c, and a stopper 32e is fixed to the slider 32d. The upper heating jig 21 is attached to the stopper 32e. The slider 32d travels along the inside of the cylinder 32a in a slidable manner. The two supports 32 are attached to a support plate 33 which is attached to a screw shaft 34. This screw shaft 34 is supported by two posts 40a and 40b and two support plates 41 and 42. A screw thread 34a of the screw shaft 34 is screwed into a screw hole formed in a pulley 36. The pulley 36 is sandwiched between fixing plates 38a and 38b with ball bearings 37a and 37b interposed between the pulley and the fixed plates respectively. The fixing plates 38a and 38b are fixed to a fixed plate 39 fixed to the two plates 41 and 42. As a consequence, when the pulley 36 is rotated, the screw shaft 34 vertically moves while the pulley 36 does not vertically move. A rotary shaft 45 is provided so as to penetrate through the base 1, and a pulley 43 is fixed to the upper end of the rotary shaft 45. A chain belt 44 is wrapped around the pulleys 36 and 43. Bevel gears 46 and 47 are coupled to the lower end of the rotary shaft 45 outside the base 1. A rotary shaft 48 and a handle 49 are attached to the bevel gears. As a result of the rotation of the handle 49, a rotating force is transmitted to the screw shaft 34 via the bevel gears 46 and 47, the rotary shaft 45, the pulley 43, the chain belt 44, and the pulley 36. Resultant vertical movement of the screw shaft 34 enables the vertical movement of the upper heating jig 21.

Figure 2A:
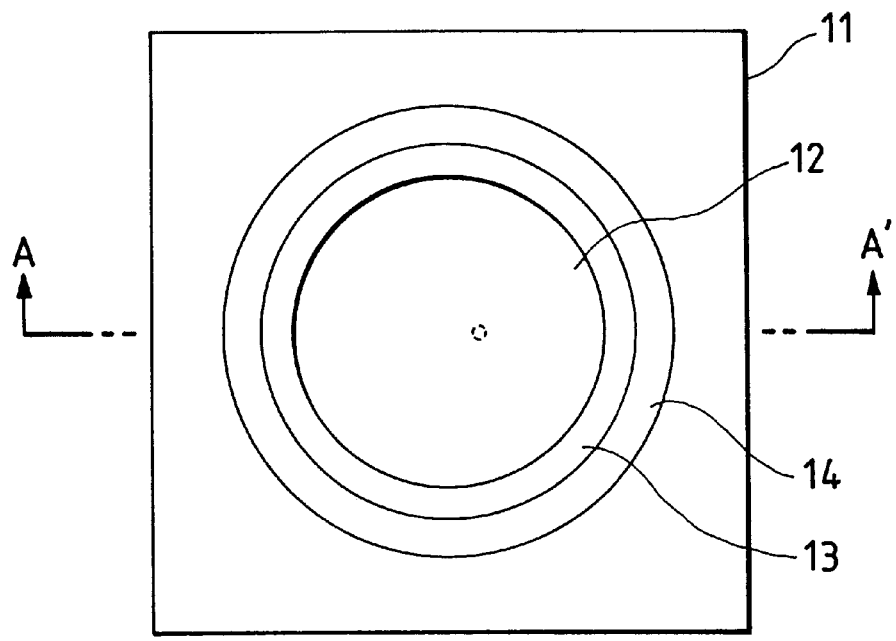
FIG. 2A is a plan view of a lower heating jig shown in FIG. 1.
Figure 2B:
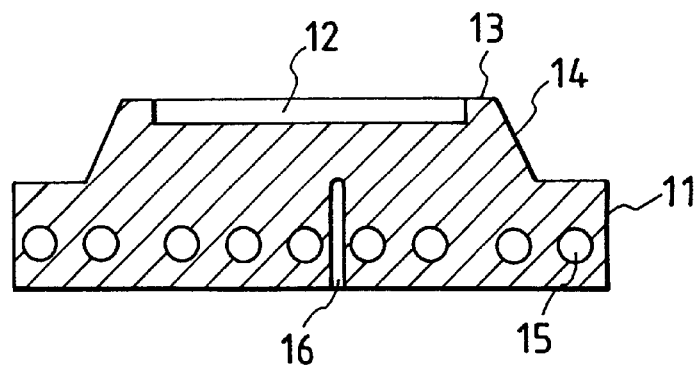
FIG. 2B is a cross-sectional view of the lower heating jig shown in FIG. 1.

FIG. 2a is a plan view of the lower heating jig shown in FIG. 1, and FIG. 2b is a cross-sectional view of the same.

Figure 4:
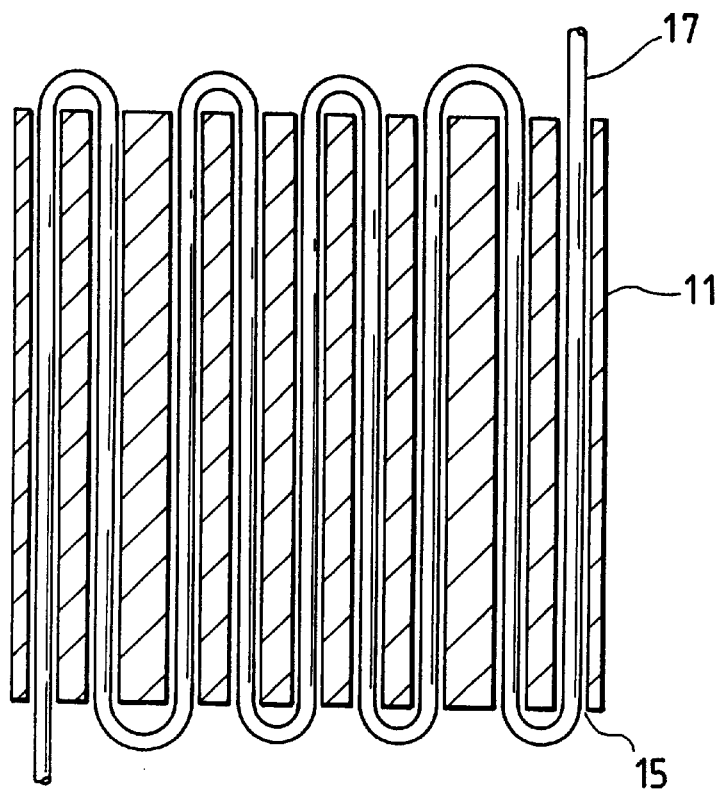
FIG. 4 is a cross-sectional view illustrating how a heater is passed into the lower heating jig shown in FIG. 1.
Figure 5:
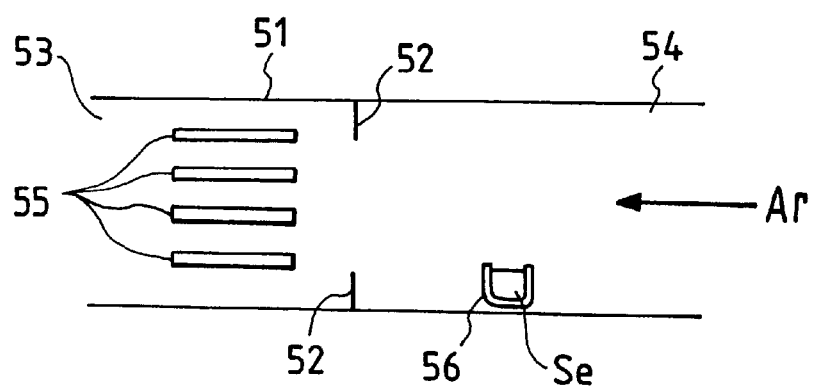
FIG. 5 is a cross-sectional view of an exemplary conventional thin-film solar cell manufacturing apparatus.
Figure 6:
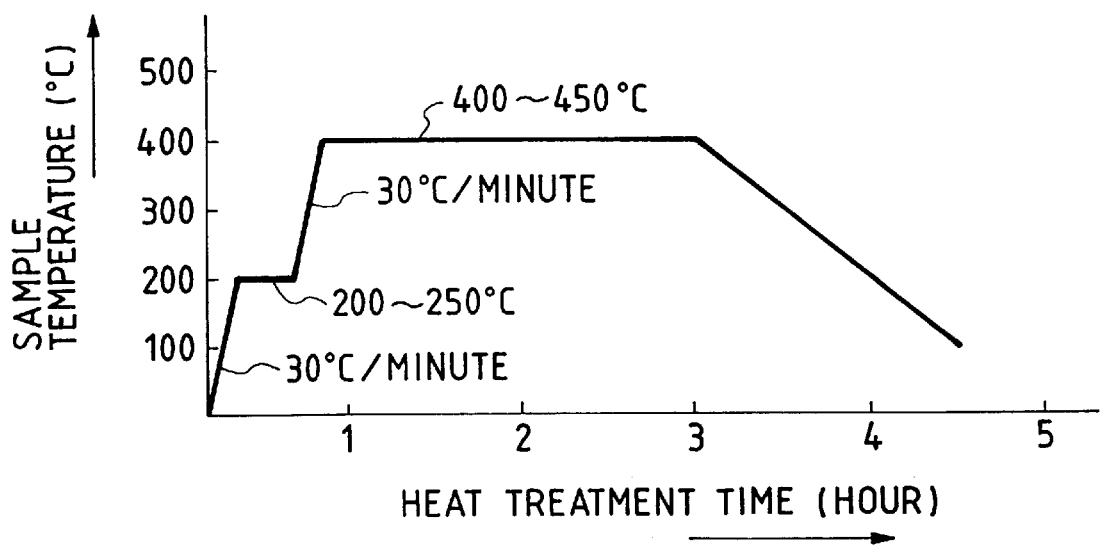
FIG. 6 is a plot for explaining conditions for heat treatment to be carried out when the conventional thin-film solar cell is manufactured.

The lower heating jig 11 is made up of a rectangular carbon block. A circular recess 12 is formed in the top surface of the rectangular carbon block so as to receive solar cells 55. A protuberance 13 is formed around the recess 12. The circumference of the carbon block is tapered, whereby a mesa-shaped block with a tapered surface 14 is formed. Apertures 15 into which a heater is inserted, and a hole 16 into which a thermocouple is inserted are formed in a lower portion of the block. As shown in FIG. 4, an insulated heater 17 is passed into the apertures 15. The carbon is electrically conductive, and hence the heater 17 must be insulated from the outside. A thermocouple 18 (see FIG. 1) is inserted into the hole 16. As a result, the lower heating jig 11 is completed.

Figure 3A:
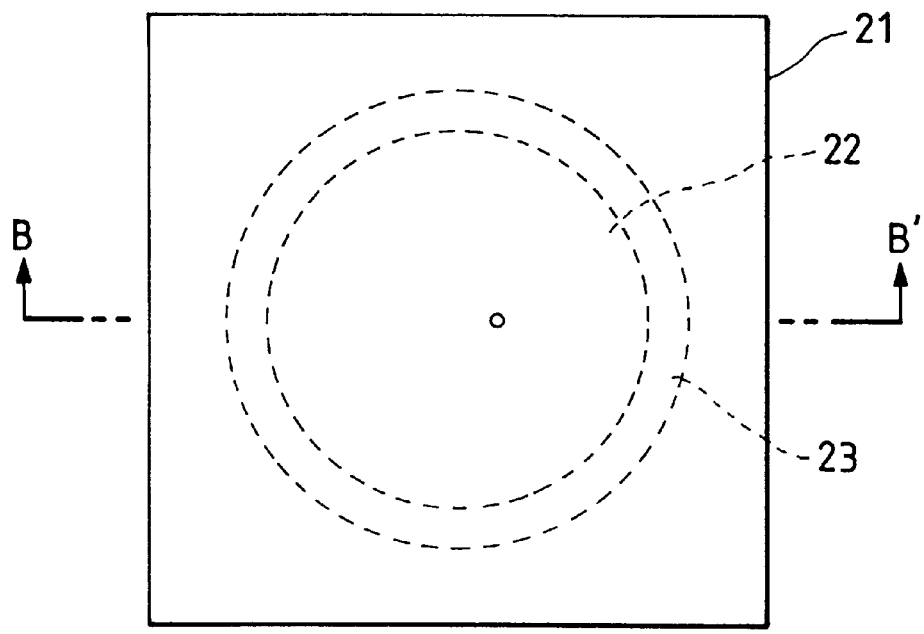
FIG. 3A is a plan view of an upper heating jig shown in FIG. 1.
Figure 3B:
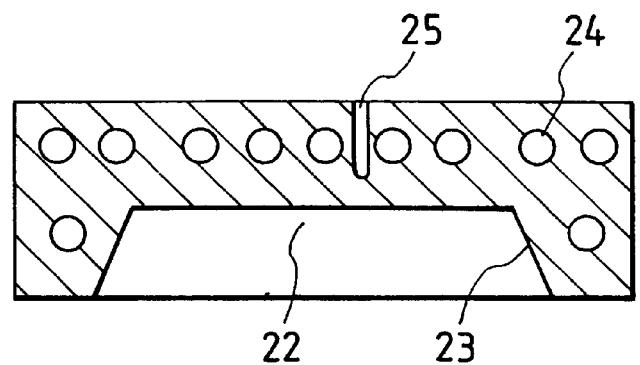
FIG. 3B is a cross-sectional view of the upper heating jig shown in FIG. 1.

FIG. 3a is a top view of the upper heating jig shown in FIG. 1, and FIG. 3b is a cross-sectional view of the same.

The upper heating jig 21 is made up of a rectangular carbon block, and a circular recess 22 is formed in the bottom surface of the carbon block to receive the mesa-shaped portion of the lower heating jig 11. A tapered surface 23 which is rubbed against the tapered surface 14 of the lower heating jig 11 is provided along the internal circumference of the recess 22. The tapered surface 14 must be hermetically rubbed against the tapered surface 23. To this end, the tapered surfaces 14 and 23 are mirror finished by rubbing. Apertures 24 into which a heater is inserted, and a hole 25 into which a thermocouple is inserted are formed in an upper part of the upper heating jig. In the same manner as shown in FIG. 4, an insulated heater is inserted into the apertures 24, and a thermocouple 28 (see FIG. 1) is inserted into the hole 25. As a result, the upper heating jig 21 is completed.

The operation of the thin-film solar cell manufacturing apparatus of the present embodiment will now be described.

The bell jar 2 is removed from the base 1, and the upper heating jig 21 is raised by rotating the handle 49. Se particles (having a particle size of 1–2 $\mu$m) are placed in the recess 12 of the lower heating jig 11, and the thin-film solar cells 55 which have not been treated yet are laid on the Se particles. The bell jar 2 is placed on the base 1, and the valve 6 is closed. A vacuum pump (not shown) is activated after opening the valve 5, so that the bell jar is evacuated. The bevel gear 46 is rotated by rotating the handle 49, which in turn rotates the bevel gear 47. As a result, the rotary shaft 45 is rotated. The rotation of the rotary shaft 45 causes the pulley 43, the chain belt 44, and the pulley 36 to rotate. The screw shaft 34 is moved downwards by means of a rotating force resulting from the rotation of the pulley 36, and the upper heating jig 21 is moved downwards. The upper heating jig 21 then comes into contact with the lower heating jig 11, whereby the recess 12 is sealed. Since the supports 32 of the upper heating jig 21 have the springs 32c provided in the cylinders 32a, an excessive pressure is absorbed by the contraction of the springs 32c even if the handle 49 is excessively rotated, which prevents the upper and lower heating jigs from fracturing. The upper heating jig 21 is pressed against the lower heating jig 11 by means of the force of the springs 32c, as a result of which the tapered surfaces 23 and 14 come into close contact with each other. Then, a seal is formed between the tapered surfaces. Eventually, the recess 12 of the lower heating jig 11 is closely sealed and evacuated.

The heater 17 is energized, and the lower and upper heating jigs 11 and 21 are heated to a temperature of, for example, about 250 centigrades which is higher than the melting point of Se, that is, 217 centigrades. The heating jigs are heated at this temperature for 30 to 60 minutes, whereby Se is gasified. The resultant Se gas diffuses into the untreated solar cells 55, and the heating jigs are further heated to a temperature of 400 to 450 centigrades for two to four hours. As a result, the CuInSe$_2$ alloy film is formed. The heater 17 is de-energized, and the heating jigs are cooled. The valve 5 is closed, and the valve 6 is then opened. Air flows into the bell jar through the gas inlet pipe 4, and the thin-film solar cells 55 are removed after the inside of the bell jar has returned to atmospheric pressure.

The tapered surface 23 of the recess 22 of the upper heating jig 21 is rubbed against the tapered surface 14 of the lower heating jig 11, whereby a seal is formed between the tapered surfaces. Accordingly, there is very little leakage of the Se gas formed from the Se powder placed in the recess 12 of the lower heating jig 11 to the outside, which results in effective utilization of the Se gas. Therefore, only a small amount of Se is required to be used, which leads to reduced cost.

Since the Se powder is heated in the vacuum, Se is not oxidized but becomes a high pressure gas in the closed space to accelerate reactions to form the CuInSe$_2$ alloy film. Further, since the Ar gas is not used, the cost thereof can be eliminated.

Also, since the Se powder is heated in the vacuum, heat dissipation resulting from convection does not arise. Further, the lower and upper heating jigs 11 and 21 are surrounded by the respective heat-shielding plates 11 and 21, thereby preventing heat dissipation. For these reasons, it is possible to heat the lower and upper heating jigs 11 and 21 using a smaller heater current.

The upper and lower heating jigs can be made from various materials. Among them, carbon is easy to machine, and it is possible to subject the tapered surfaces to be rubbed against each other to a mirror finish. It is easy for the carbon jigs to form a sealed space, and carbon is inexpensive. Therefore, carbon is the most desirable material for the upper and lower heating jigs.

As described above, according to this embodiment of the invention, a sealed space is formed between the upper and lower heating jigs, and the solar cells are thermally treated with Se in the sealed space. It is possible to treat the solar cells in the pressurized Se atmosphere. Further, it is possible to sufficiently promote the reaction of Se with the solar cells and to reduce the amount of Se to be used. As a result, the manufacturing cost can be reduced.

According to the present invention, the solar cells are thermally treated in the vacuum, which prevents the use of the Ar gas. Therefore, it is possible to further reduce the manufacturing cost by the amount corresponding to the cost of the Ar gas.

The upper and lower heating jigs are surrounded by the heat-shielding plates in order to prevent heat dissipation, and the solar cells are thermally heated in the vacuum. Therefore, it is possible to heat the upper and lower heating jigs using a smaller heater current.

Next, a thin-film solar cell manufacturing method of a second embodiment of the present invention will be described.

The manufacturing method comprises four steps of:
  (1) forming a molybdenum layer on a substrate by sputtering;
  (2) forming a copper layer on the molybdenum layer by sputtering;
  (3) completing a precursor by electrically depositing a selenium-dispersed indium layer on the copper layer in a solution which includes indium ions and dispersed selenium colloid; and (4) putting the precursor and selenium in a container, and heating the container after it has been sealed.

If soda-lime glass having substantially the same thermal expansion coefficient as $CuInSe_2$ is used as the substrate, the precursor becomes less apt to delaminate when it is subjected to heat treatment. Further, alkali components in the glass contribute to the improved crystallinity of $CuInSe_2$. Thus, the soda-lime glass is desirable.

The molybdenum layer is electrically conductive and is necessary as an electrode which constitutes the solar cell. To ensure close contact between the molybdenum layer and the substrate, it is necessary to form the molybdenum layer by sputtering.

By the same reason, it is necessary to form the copper layer by sputtering.

In the above described solution including indium ions ($In^{3+}$) and selenium colloid, indium ions are obtained by dissolving indium salt, for example, indium sulfate, into water. The selenium colloid is obtained by reducing, for example, selenious acid with hidrazinium sulfate.

The particle size of the thus obtained selenium colloid particles should preferably be below 1 µm. If the size of the colloid particles is larger than 1 µm, it becomes difficult to evenly disperse the selenium colloid in the solution. Further, the selenium colloid tends not to be evenly dispersed in the indium layer formed as a result of electrodeposition.

The electrically deposited indium layer including the dispersed selenium colloid must be formed on the copper layer. That is, the respective layers must be formed in such an order that the copper layer is laid on the conductive substrate and the selenium-particle-containing indium layer is laid on the copper layer. This is because a compound formed by the reaction of selenium and molybdenum which is contained in the conductive substrate, hinders the generation of a copper-indium-selenium ternary alloy of the absorbing layer, it also prevents the growth of the crystal of this ternary alloy, and the finally resultant absorbing layer becomes apt to delaminate.

It is preferable to set electrodeposition conditions in such a way that a ratio of indium atoms to selenium atoms in the electrically deposited indium layer comprising dispersed selenium colloid particles becomes more than 1/1000 and less than 2/1.

If the ratio of indium atoms to selenium atoms is less than 1/1000, a yield of the copper-indium-selenium ternary alloy becomes likely to decrease, because the amount of selenium fed from the film becomes smaller while the precursor is being heated. If a large amount of selenium is fed to the precursor from the outside in order to prevent the shortage of selenium during the heat treatment, distortion appears in the copper-indium-selenium ternary alloy since it fails to withstand expansion resulting from formation of the ternary alloy layer. Eventually, the ternary alloy layer becomes apt to delaminate from the substrate.

On the other hand, if the ratio of the indium atoms to selenium atoms is more than 2/1, it becomes easy for copper and selenium to form a stable chemical compound. For this reason, the yield of the copper-indium-selenium ternary alloy becomes smaller, and the compound consisting of copper and selenium prevents the growth of the copper-indium-selenium ternary alloy crystal. As a result, it becomes difficult to obtain the grown ternary alloy crystal.

As mentioned above, the precursor, in which the electrically deposited indium layer including dispersed selenium colloid, is rinsed under ion-exchanged water, and the thus rinsed precursor is then dried. It is desirable to dry the precursor in a nitrogen gas or an inert gas in order to obtain a superior absorbing layer.

The precursor is put in a sealed container together with a selenium powder, and the system is replaced by argon or nitrogen. After having been depressurized as required, the container is heated at a temperature of 400 to 550 degrees centigrade. It is desirable to heat the container at a temperature of 500 to 550 degrees centigrade, because the ternary alloy grows faster at this temperature.

The copper-indium-selenium alloy ($CuInSe_2$) is formed as an absorbing layer as a result of the heat treatment, and its crystal grows.

In this embodiment of the present invention, the molybdenum layer is formed by sputtering, and the copper layer is formed on the molybdenum layer by sputtering, and then the selenium-dispersed indium layer is formed. The compound formed by the reaction of selenium with molybdenum is not generated, and hence the contact between the molybdenum layer and the copper-indium-selenium alloy layer becomes much superior.

The selenium colloid particles are stable in a plating solution and will not settle. For this reason, special means for stirring the plating solution during a plating operation becomes unnecessary, and the selenium colloid particles are evenly dispersed in the electrically deposited layer. Further, since the selenium colloid particles are small, the formed selenium-dispersed indium layer becomes considerably less apt to come away from the substrate.

The selenium particles are dispersed in the indium layer, and hence they are not much densely concentrated, which allows the indium layer to withstand expansion of the layer resulting from the formation of the ternary alloy when the precursor is heated. Eventually, a ternary alloy layer which does not come away from the substrate is formed.

The precursor is heated by use of selenium and the closed container, and hence the heat treatment is safe and easy to perform. Further, the use of expensive inert gas becomes unnecessary.

EXAMPLE 1

Molybdenum and copper are formed on a blue glass plate to a thickness of 2 µm and a thickness of 0.3 µm, respectively, by sputtering.

A selenium colloid solution was prepared in the following order:

4 ml gelatin solution (4 g/l), 10 ml selenious acid (0.1 mol/l), 10 ml hydrazinium sulfate (0.1 mol/l), and 30 ml purified water were mixed. Thereafter, the mixture was heated at a temperature of 40 degrees centigrade for 45 minutes. The thus obtained mixture is controlled in such a way that its Ph becomes 2, whereby the colloid becomes stable. As a result, the selenium colloid solution is obtained. The addition of gelatin is intended to stabilize the selenium colloid.

Colloid particles of the thus prepared selenium colloid solution were examined by a scanning electron microscope. The size of the selenium colloid particles ranges more than 10 nm and less than 100 nm. Even when the selenium colloid solution was left for a long period of time, the selenium particles did not settle. Thus, the selenium colloid solution is very stable.

A plating solution was prepared so as to comprise 10 mmol/l selenium colloid, 50 mmol/l indium sulfate, 80 mmol/l sodium sulfate, and 50 mmol/l sodium citrate, using the above described selenium colloid solution.

The thin film was plated in the above described plating solution by applying a voltage of 1.5 V with respect to a reference electrode, i.e., a mercurous sulfate electrode. At this time, a platinum plate was used as a counter electrode.

The plating solution was very stable, and the colloid particles in the plating solution did not settle. Therefore, the plating solution was not stirred up. A selenium-dispersed indium layer which was electrically deposited had a thickness of 0.7 μm. The ratio of indium atoms and selenium atoms in the electrically deposited indium layer which comprises the dispersed selenium colloid particles was 10:2 as a result of composition analysis carried out using an energy dispersion X-ray analyzer (hereinafter simply referred to as an EDX). The electrically deposited selenium-dispersed indium layer was very even.

The thin film plate after plating was dried in a nitrogen gas, and the thus dried thin film plate was subjected to heat treatment using the closed heating furnace shown in FIG. 1.

The precursor 20 and a selenium powder (not shown) are placed in the heating jig 11 of the heating furnace, and the bell jar 2 is closed. Then, after the valve 6 has been closed, a vacuum pump (not shown) is connected to the gas outlet pipe 3, and the bell jar 2 is evacuated. Subsequently, the valve 5 is closed, and an argon gas cylinder (not shown) is connected to the gas inlet pipe 4. Then, an argon gas is introduced into the bell jar 2. The air in the bell jar 2 is replaced with the argon gas by repeatedly carrying out the above mentioned operations three times.

The cover 21 is closed to seal the heating jig 11 by the opening and closing mechanism.

The heating jig 11 and the cover 21 are heated by their heaters to a temperature of 550 degrees centigrade at a rate of 25 degrees centigrade/min. The thus heated jig and cover are maintained for 60 minutes. Subsequently, they are left to cool by themselves, whereby an absorbing layer of the thin-film solar cell was obtained.

It may be conceived that selenium vaporized as a result of the heat treatment (which is much less toxic than the hydrogen selenide) leaks from the heating jig 11 and the cover 21 to a certain extent. Even in such an event, the vaporized selenium gas does not escape out of the bell jar 2.

In the thus obtained absorbing layer, the ratio between copper atoms, indium atoms, and selenium atoms was 23.5:24.5:52.0 which were approximate to 1:1:2. As a result of X-ray diffraction of the absorbing layer, it was also acknowledged that the absorbing layer was chalcopyrite $CuInSe_2$ having a large crystal and superior orientation.

Delamination of the absorbing layer was not observed.

As mentioned above, according to this embodiment of the present invention, it is possible to safely and easily manufacture a superior $CuInSe_2$ ternary alloy thin film which is less apt to delaminate at low cost.

A thin-film solar cell manufacturing method according to a third embodiment of the present invention will next be described.

The manufacturing method comprises the steps of:

forming a copper-selenium layer on a conductive substrate by means of plating, using a solution including copper ions ($Cu^{2+}$) and selenium ions ($Se^{4+}$);

completing a precursor by forming an indium-selenium layer by means of plating, using a solution including indium ions ($In^{3+}$) and selenium ions ($Se^{4+}$); and subjecting the thus formed precursor to heat treatment.

When the selenium content in the copper-selenium layer becomes large, the copper-selenium layer becomes very fragile, and hence extra special care must be taken with the handling of this layer during the course of the processing. This copper-selenium layer may often bring about imperfect products, which in turn results in decreased manufacturing yields of the thin-film solar cell. To prevent this problem, it is desirable to suppress the content of selenium atoms in the copper-selenium layer to less than 20%.

The copper-selenium layer and the indium-selenium layer are plated on the conductive substrate such as a glass substrate having chromium and molybdenum thin-film electrodes laminated on its surface. As a consequence of this, the copper-selenium layer is formed on the conductive substrate, and the indium-selenium layer is formed on the copper-selenium layer. Subsequently, the thus formed layer is subjected to heat treatment at a temperature of 400 degrees centigrade in an inert gaseous atmosphere such as an argon gas (which includes a mixture of selenium vapor as required). As a result of the integration of the copper-selenium layer and the indium-selenium layer, a copper-indium-selenium alloy ($CuInSe_2$) is formed, and the crystal of this alloy grows.

The thin-film solar cell manufacturing method of this embodiment of the present invention uses the plating method to form the absorbing layer, and hence equipment including an evacuating system becomes unnecessary.

The copper-selenium layer is formed on the conductive substrate, and the indium-selenium layer is formed on the copper-selenium layer, and therefore it is easy to measure and control the ratio of the three elements.

After the completion of the plating operation, a copper-selenium alloy (CuSe) is first formed in the portion of the copper-selenium layer adjacent to the conductive layer as a result of heat treatment. The thus formed copper-selenium alloy acts as one type of seed crystal to form the copper-indium-selenium alloy ($CuInSe_2$), whereby the ternary alloy layer consisting of the three elements is formed. For this reason, the copper-indium-selenium alloy ($CuInSe_2$) crystal is oriented in the thicknesswise direction of the layer. At the same time, the copper-indium alloy which does not contribute to photoelectric conversion develops only slightly.

Further, the copper-indium-selenium alloy comprising a large ratio of the copper atoms is first formed, and this ternary alloy changes into the copper-indium-selenium alloy that is close to a stoichiometric ratio, that is, Cu:In:Se=1:1:2. For this reason, it is less likely for the stable copper-indium alloy to arise.

As a result, it is possible to obtain the absorbing layer comprising a large copper-indium-selenium crystal.

EXAMPLE 2

To begin with, first and second plating baths are prepared.

Specifically, one liter of plating bath (hereinafter referred to as a first plating bath) is prepared by dissolving copper sulfate (10 mmol), selenium oxide (5 mmol), sodium sulfate (80 mmol), and sodium citrate (25 mmol) in water.

One liter of another plating bath (hereinafter referred to as a second plating bath) is prepared by dissolving indium sulfate (50 mmol), selenium oxide (10 mmol), sodium sulfate (80 mmol), and sodium citrate (25 mmol) in water.

A conductive substrate is then manufactured. That is, a chromium thin film is formed on a glass substrate to a thickness of 0.2 μm by sputtering, and a molybdenum thin film is formed on the chromium thin film to a thickness of 2 μm by sputtering.

In one liter of a water solution containing potassium ferricyanic acid 150 g and potassium hydroxide of 50 g, the conductive substrate used as a positive electrode was electrolytically etched under conditions of 50 mA/cm² for 20 seconds, using a carbon electrode as a negative electrode.

The thus etched substrate is plated in the first plating bath by applying a voltage of −1800 mV with respect to a mercurous sulfate electrode. At this time, the resultant quantity of electric charge was 1.6 C/cm². The molar ratio of copper to selenium in the thus obtained film was 92.2:7.8.

Subsequently, using a platinum plate as a positive electrode, constant voltage plating is carried out in the second plating bath with a voltage of −1500 mV with respect to the mercurous sulfate electrode. At this time, the resultant quantity of electric charge was 2.0 C/cm². In the resultantly obtained film, the ratio of copper atoms to selenium atoms is 92.2:7.8.

The plated thin film plate is dried in nitrogen, and it is then subjected to heat treatment in the Argon gas at a temperature of 500 degrees centigrade for one hour in an atmosphere of selenium, whereby an absorbing layer of the thin-film solar cell is manufactured.

The ratio between copper atoms, indium atoms, and selenium atoms in the thus obtained absorbing layer was 24.3:24.7:51.0, which is approximately equal to the stoichiometric ratio of 1:1:2.

This absorbing layer is free from failures such as cracks or delamination of the film.

This absorbing layer was subjected to X-ray diffraction. Table 1 shows its results.

TABLE 1

RESULTS OF X-RAY DIFFRACTION
(X-RAY DIFFRACTION STRENGTH OF COPPER-INDIUM-SELENIUM TERNARY ALLOY CRYSTAL)

| Crystal plane | 112 plane | 204 and 220 planes |
| --- | --- | --- |
| Diffraction strength | 13200 cps | 2100 cps |

EXAMPLE 3

One liter of a first plating bath is prepared by dissolving copper sulfate (10 mmol), selenium oxide (15 mmol), sodium sulfate (80 mmol), and sodium citrate (25 mmol) into water. Except for the first plating bath, the absorbing layer is formed on the conductive substrate in the same manner as in the first embodiment.

The ratio of the copper atoms to selenium atoms in the film obtained as a result of plating the conductive substrate in the first plating bath was 79.3:20.7.

The ratio between copper atoms, indium atoms, and selenium atoms in the thus obtained absorbing layer was approximately equal to a ratio of 1:1:2. Small cracks in the absorbing layer were observed. Further, the absorbing layer was partially delaminated.

This absorbing layer was subjected to X-ray diffraction analysis. Table 2 shows results.

TABLE 2

RESULTS OF X-RAY DIFFRACTION
(X-RAY DIFFRACTION STRENGTH OF COPPER-INDIUM-SELENIUM TERNARY ALLOY CRYSTAL)

| Crystal plane | 112 plane | 204 and 220 planes |
| --- | --- | --- |
| Diffraction strength | 12900 cps | 2000 cps |

COMPARATIVE EXAMPLE

The plating bath was controlled so as to comprise 10 mmol/l selenium, 50 mmol/l indium sulfate, 80 mmol/l sodium sulfate, 50 mmol/l sodium acetate by use of a selenium powder having a particle size of 1–10 μm. The conductive substrate manufactured in the same manner as in the embodiments was plated in this plating bath by constantly applying a voltage of −1500 mV with respect to the mercurous sulfate electrode.

To prevent sedimentation of the selenium powder, it was necessary to constantly stir the plating solution.

As in example 2, the absorbing layer of the thin-film solar cell was manufactured by subjecting the conductive substrate to heat treatment. At this time, the ratio between copper atoms, indium atoms, and selenium atoms in the thus obtained absorbing layer was approximately equal to a ratio of 1:1:2. Small cracks in the absorbing layer were observed. Further, the absorbing layer was partially delaminated. This absorbing layer was subjected to X-ray diffraction analysis. Table 3 shows results.

TABLE 3

RESULTS OF X-RAY DIFFRACTION
(X-RAY DIFFRACTION STRENGTH OF COPPER-INDIUM-SELENIUM TERNARY ALLOY CRYSTAL)

| Crystal plane | 112 plane | 204 and 220 planes |
| --- | --- | --- |
| Diffraction strength | 295 cps | 842 cps |

When the results of Table 1 and Table 3 are compared with each other with respect to the diffraction strength, the absorbing layer of example 2 has about 45 times the diffraction strength of the comparative example obtained for 112 plane and about 2.5 times the diffraction strength of the same obtained for 204 and 220 planes.

A ratio of diffraction strength of (112) to (204) and (220) of example 2 is 6.3, and the ratio of the comparative example is 0.35. Example 2 evidently shows the existence of the crystal, and it can be seen that the absorbing layer of example 2 has superior crystal orientation.

As is evident from examples 2 and 3, the comparative example, and the results of X-ray diffraction of the absorbing layers of the thin-film solar cells, it is possible to stably obtain an absorbing layer which comprises fully grown copper-indium-selenium ternary alloy having superior orientation without the use of an expensive vacuum evaporator.

What is claimed is:

1. A thin-film solar cell manufacturing method comprising the steps of:

(1) forming a molybdenum layer on a substrate by sputtering;

(2) forming a substantially pure copper layer on the molybdenum layer by sputtering;

(3) completing formation of a precursor by electrically depositing a selenium-dispersed indium layer on the copper layer in a solution which includes indium ions and dispersed selenium colloid; and (4) putting the precursor and selenium in a container, and heating the container after it has been sealed.

2. A thin-film solar cell manufacturing method comprising the steps of:

forming a copper-selenium layer on a conductive substrate by means of plating, using a solution including copper ions and selenium ions;

completing formation of a precursor by forming an indium-selenium layer by means of plating, using a solution including indium and selenium ions; and subjecting the thus formed precursor to heat treatment, wherein the solution including copper ions and selenium ions is controlled in such a way that a selenium content in the copper-selenium layer is equal to or less than 20 mol %.

* * * * *